United States Patent [19]

Yamazaki et al.

[11] Patent Number: 4,856,458
[45] Date of Patent: Aug. 15, 1989

[54] PHOTO CVD APPARATUS HAVING NO ULTRAVIOLET LIGHT WINDOW

[75] Inventors: Shunpei Yamazaki, Tokyo; Toshiji Hamatani, Atsugi, both of Japan

[73] Assignee: Semiconductor Energy Laboratory Co., Ltd., Kanagawa, Japan

[21] Appl. No.: 53,726

[22] Filed: May 26, 1987

[30] Foreign Application Priority Data

May 27, 1986 [JP] Japan .................. 61-122859
May 27, 1986 [JP] Japan .................. 61-122860

[51] Int. Cl.$^4$ ............................. C23C 16/00
[52] U.S. Cl. ..................... 118/722; 118/715; 118/50.1; 118/620
[58] Field of Search ............ 118/722, 715, 50.1, 118/620

[56] References Cited

U.S. PATENT DOCUMENTS 3,372,672 3/1968 Wright .................. 427/54.1
4,474,829 10/1984 Peters .................. 427/53.1

*Primary Examiner*—Richard Bueker
*Attorney, Agent, or Firm*—Gerald J. Ferguson, Jr.

[57] ABSTRACT

An improved Photo CVD apparatus having no window for ultraviolet light is shown. In the reaction chamber of the apparatus, an ultraviolet light source is placed directly in the chamber filled with the process gas so that no loss of light is there and high deposition speed is obtained. This structure is realized by providing extra rooms in the reaction chamber to protect the terminals of the electrodes.

9 Claims, 3 Drawing Sheets

PHOTO CVD APPARATUS HAVING NO ULTRAVIOLET LIGHT WINDOW

BACKGROUND OF THE INVENTION

The present invention relates to a photo enhanced CVD apparatus for depositing thin film product on the basis of in opto-chemical vapor phase reaction.

Recently, in the field of thin film formation process for non-single-crystalline silicon semiconductors or for passivation of semiconductor devices, chemical vapor deposition enhanced by optical energy (hereafter called Photo CVD) has aroused interest to artisans.

The Photo CVD process comprises disposing a substrate in a reaction chamber, inputting process gas into the reaction chamber at a negative pressure, initiating opto-chemical vapor reaction by irradiating the process gas with ultraviolet light and depositing the product of the reaction on the substrate in the form of a thin film. The ultraviolet light is radiated from an ultraviolet soruce through a transmissive window which is made of quartz glass, including lithium fluoride or magnesium fluoride or so on. Together with process gas, mercury may be introduced to accelerate the deposition speed. The window for ultraviolet light can be designed with a larger dimension by reducing the pressure in the light source room.

There are some problems in such a Photo CVD process. Because process gas is in contact with the window for ultraviolet light, the opto-chemical reaction takes place also near the window by ultraviolet light passing therethrough, and therefore the product is deposited on the window during the process and deteriorates the transparency of the window. For this reason, the window eventually become opaque and the opto-chemical reaction is quenched.

To solve the above problem, it has been proposed to coat the window with oil to prevent the formation of the product on the window. The coated oil, however, substantially degrades the quality of film deposited by comtaminating the film with its ingredient.

Another problem is that the temperature of the light source substantially rises as it is emitting ultraviolet light, due to radiation heat from a heater for substrate heating or due to heat induced by the light source itself. The temperature rises, e.g., 300° C. At such a high temperature, the intensity distribution of ultraviolet light is changed, particularly in the wavelength range less than 300 nm, it is reduced by 50%, and therefore the deposition speed becomes lowered very much.

Further, it may be also a problem that the cost of system for this process becomes high because of the high cost of quartz glass and magnesium fluoride.

Still further, such a Photo CVD process is not suitable for mass-production because of the very low deposition speed.

SUMMARY OF THE INVENTION

It is therefore an object of the invention to provide a Photo CVD apparatus capable of depositing excellent film of high quality.

It is another object of the invention to provide a Photo CVD capable of depositing thick film.

It is a further object of the invention to provide a Photo CVD having a high deposition speed.

BRIEF DESCRIPTION OF THE INVENTION

DETAILED DESCRIPTION OF THE PREFERRED EMBODIMENTS OF THE INVENTION

Figure 1A:
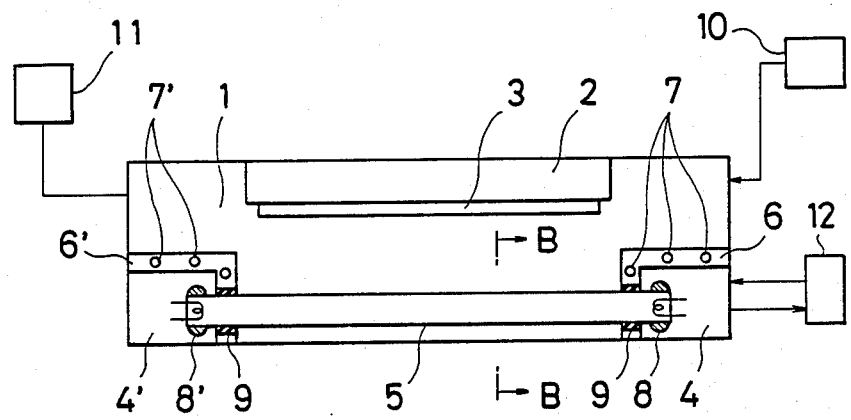
FIG. 1(A) is a cross sectional view showing an embodiment of the invention.
Figure 1B:
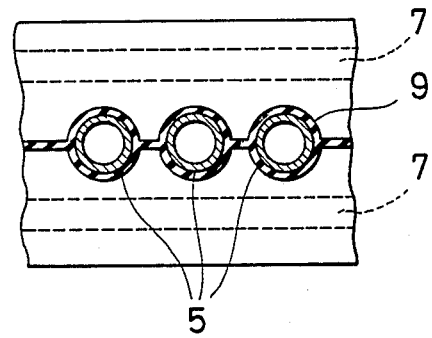
FIG. 1(B) is a cross sectional view taken along a plane perpendicular to that of FIG. 1(A) and showing the embodiment.

Referring now to FIGS. 1(A) and 1(B), a Photo CVD apparatus according to the invention is illustrated. The apparatus comprises a reaction chamber 1, a heater 2 on which a substrate is supported, mercury lamps 5 and supporting structures 6 and 6' for the mercury lamp 5. The supporting structures define a pair of extra rooms 4 and 4' and supports the mercury lamp through packing members 9 and 9' made from heat-proof fluoride rubber in a manner that either end is inserted into the extra room. Both ends of the mercury lamp where a pair of electrodes is provided are cooled by means of cooling means such as water tube 8 and 8'. The supporting structure 6 and 6' are formed with water conduits 7 and 7' therein and are made from material having a high heat conductivity, .e.g, metal such as stainless steel, nickel, aluminium. Process gas is inputted from a gas introducing system 10 and exhausted by means of a vacuum pump 11.

The cooling of the mercury lamp 5 may be also carried out by having an amount of cooling gas circulate through the rooms 4 and 4' by means of circulation means 12. Since the cooling gas may enter the reaction chamber through the rubber packing 9, it must be selected such that no influence be caused on the opto-chemical reaction. For example, hydrogen gas can be employed when non-single-crystalline silicon semiconductor is formed, also nitrogen gas can be employed when silicon nitrogen gas is formed.

Figure 2A:
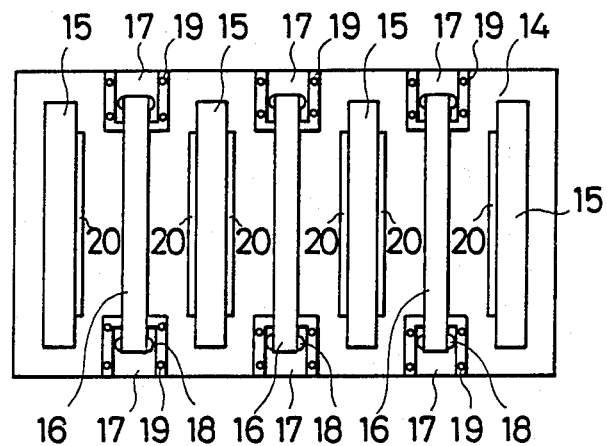
FIG. 2(A) is a cross sectional view taken along a horizontal plane showing another embodiment of the invention.
Figure 2B:
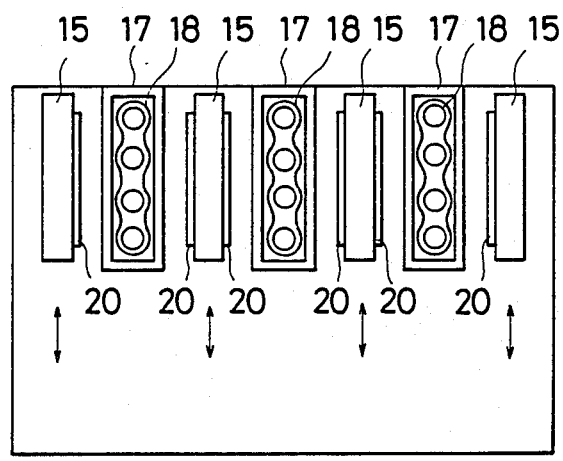
FIG. 2(B) is a cross sectional view taken along a vertical plane showing the later embodiment of the invention.

Referring to FIGS. 2(A) and 2(B), another embodiment of the invention is shown. In the figure, mercury lamps 16 are supported between opposed substrates 20 respectively. The mercury lamps 16 are supported by supporting structures 19 and provided with cooling means respectively in the same manner as illustrated in FIGS. 1(A) and 1(B). Between two substrates opposite to each other, four mercury lamps 16 are arranged in order to irradiate the substrates uniformly with sufficient power as shown in FIG. 2(B). The substrates 16 are mounted on both surfaces of heaters 15 respectively except for the rightmost and the leftmost. The heaters are so provided in the reaction chamber as to move in the vertical direction. With the heaters 15 disposed between the mercury lamps 16 at their upper positions, deposition can be carried out on the substrates by Photo CVD. When the heaters are, in turn, moved down to their lower position, they can be placed aside by shifting same in a lateral direction so that new substrates can be easily substituted for the coated substrates 16.

Experiment 1

The deposition condition is

| gas flow rate; | Si$_2$H$_6$, 10 SCCM |
| --- | --- |
| | NH$_3$, 500 SCCM |
| | N$_2$, 500 SCCM |
| pressure in reaction chamber; | 400 Pa |
| substrate temperature; | 300° C. |

Figure 3:
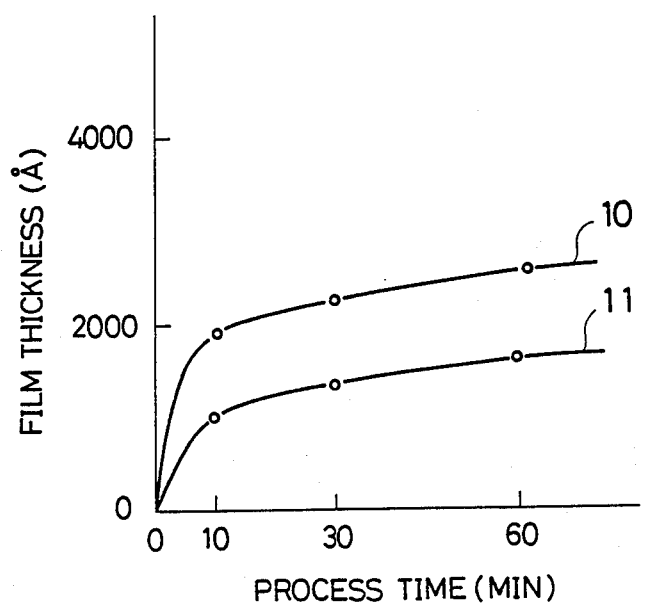
FIGS. 3 and 4 are graphical diagrams showing the relationship between the film thickness and the process time.
Figure 4:
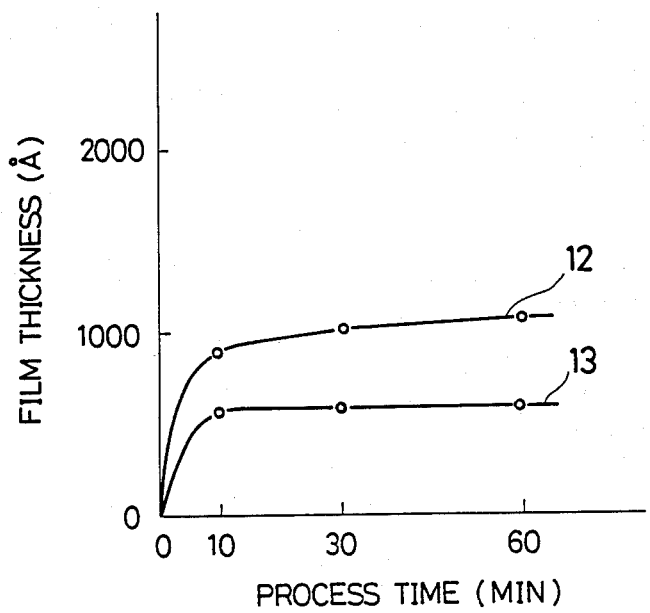

Nitrogen gas as a cooling gas is circulating through the extra rooms 17. Through the cooling conduits 18 and 19 is circulated water at 25° C. FIG. 3 is a graphical diagram showing the relationship the thickness of film deposited and the process time in accordance with the experiment. With a curve 21 is shown a conventional relationship. According to the prior art, a film with about 1500 Å in thickness was obtained in virtue of the opto-chemical reaction for 60 minutes but thereafter further deposition was not observed. This means that, at the time, film deposited on the window for ultraviolet light obstructs the transmission of light through the window. A curve 22 is depicted according to this experimental result. As shown in the diagram, a limit to the thickness of deposited film appears also in curve 22. However, the limit was about 2500 Å and the deposition speed was very high as compared with the prior art. The high efficiency of the deposition in accordance with the invention is attained not only due to the effect of cooling but also due to the removal of the window interposed between the light source and the reaction space. In addition, the number of substrates which can be treated in a process according to the invention is twice or more as large, with smaller number of light sources, as compared with the prior art.

Experiment 2

With the same Photo CVD apparatus as used in Experiment 1, amorphous silicon film was formed.

10% Si$_2$H$_6$ diluted with He was introduced into the reaction chamber as the process gas. Other deposition conditions were the same as that of the Experiment 1 so that redundant explanation will be not repeated. The relationship between the process time and the thickness of the amorphous film is depicted with a curve 23 obtained by the experiment and a conventional curve 24 is also illustrated for reference. The limits to the thickness of deposited film appear at 500 Å in the prior art after deposition for 10 munites, and at 1000 Å in this experiment according to the invention also after deposition for 10 minutes.

While the present invention is described in conjunction with the particular embodiments, it should not be limited to these embodiments and many variations and modifications can occur to those skilled in the art.

What is claimed is:

1. A photo-CVD apparatus comprising:
   a reaction chamber in which an optical reaction space is defined;
   a gas feeding system for introducing a reactive gas into said reaction chamber;
   a lamp provided with a central light emitting portion and an electrode at each end for emitting light rays to said reaction space; and
   a cooling system surrounding the ends of said lamp so that the central light-emitting portion of said lamp is exposed to said reaction chamber to directly illuminate the reaction chamber while the ends of said lamp are cooled by said cooling system.

2. An apparatus of claim 1 wherein said lamp is an airtight tube filled with a vapor material which emits light in virtue of discharge between said electrodes.

3. An apparatus of claim 2 further comprising means for cooling the vicinity of said electrodes in said reaction chamber.

4. An apparatus of claim 3 wherein said cooling means is water circulating pipe wound around said tube near said electrode.

5. An apparatus of claim 3 wherein said cooling means is a conduit provided around said reaction chamber.

6. An apparatus of claim 3 wherein said light source is a mercury lamp having a tube at whose ends said electrodes are provided.

7. An apparatus of claim 6 wherein one wall of said reaction chamber is formed with an opening by which one end of said light source is supported.

8. An apparatus of claim 7 wherein said wall is made from a metal.

9. An apparatus of claim 8 wherein said wall is formed with a conduit through which water is circulated.

* * * * *